US012532634B2

(12) United States Patent
Yu et al.

(10) Patent No.: US 12,532,634 B2
(45) Date of Patent: Jan. 20, 2026

(54) DISPLAY MODULE AND DISPLAY DEVICE HAVING SAME

(71) Applicant: BOE Technology Group Co., Ltd., Beijing (CN)

(72) Inventors: Hongtao Yu, Beijing (CN); Qing Wang, Beijing (CN); Kuanta Huang, Beijing (CN); Hui Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 588 days.

(21) Appl. No.: 17/922,088

(22) PCT Filed: Sep. 1, 2021

(86) PCT No.: PCT/CN2021/116037
§ 371 (c)(1),
(2) Date: Oct. 28, 2022

(87) PCT Pub. No.: WO2022/088961
PCT Pub. Date: May 5, 2022

(65) Prior Publication Data
US 2023/0172003 A1 Jun. 1, 2023

(30) Foreign Application Priority Data

Oct. 27, 2020 (CN) .......................... 202011166196.3

(51) Int. Cl.
*H10K 59/122* (2023.01)
*H10K 59/38* (2023.01)
*H10K 59/80* (2023.01)

(52) U.S. Cl.
CPC ........... *H10K 59/38* (2023.02); *H10K 59/122* (2023.02); *H10K 59/873* (2023.02);
(Continued)

(58) Field of Classification Search
CPC .... H10K 59/38; H10K 59/122; H10K 59/873; H10K 59/8731; H10K 59/875;
(Continued)

(56) References Cited

U.S. PATENT DOCUMENTS

2014/0027798 A1   1/2014   Sato et al.
2015/0084023 A1   3/2015   Sato

FOREIGN PATENT DOCUMENTS

CN   103579291 A   2/2014
CN   105487315 A   4/2016
(Continued)

OTHER PUBLICATIONS

First Office Action dated Apr. 27, 2023 corresponding to Chinese application No. 202011166196.3.
(Continued)

*Primary Examiner* — Elmito Breval
(74) *Attorney, Agent, or Firm* — Nath, Goldberg & Meyer; Joshua B. Goldberg

(57) ABSTRACT

Provided are a display module and a display device having the same. The display module includes: a drive substrate, a pixel definition layer, an OLED device layer, a color filter layer including sub-filter regions arranged in one-to-one correspondence to sub-pixel regions, and at least one blocking layer disposed on a side of the OLED device layer away from the drive substrate. Each blocking layer includes opening regions disposed to face the sub-pixel regions along a thickness direction of the drive substrate, and light shielding regions disposed to face portions of two adjacent sub-filter regions at which the two sub-filter regions are connected, along the thickness direction of the drive substrate. A length of a connecting line between two ends of each light
(Continued)

shielding region is less than an actual length of the light shielding region on a cross section perpendicular to the drive substrate.

15 Claims, 4 Drawing Sheets

(52) U.S. Cl.
CPC ....... *H10K 59/8731* (2023.02); *H10K 59/875* (2023.02); *H10K 59/879* (2023.02); *H10K 59/8792* (2023.02)

(58) Field of Classification Search
CPC ............. H10K 59/879; H10K 59/8792; H10K 59/126; H10K 2102/351
See application file for complete search history.

(56) References Cited

FOREIGN PATENT DOCUMENTS

| | | |
|---|---|---|
| CN | 107731877 A | 2/2018 |
| CN | 109283734 A | 1/2019 |
| CN | 109728054 A | 5/2019 |
| CN | 110335883 A | 10/2019 |
| CN | 110828698 A | 2/2020 |
| JP | 2009104969 A | 5/2009 |

OTHER PUBLICATIONS

Extended European Search Report dated Jan. 23, 2024 corresponding to application No. 21884692.1.

DISPLAY MODULE AND DISPLAY DEVICE HAVING SAME

CROSS-REFERENCE TO RELATED APPLICATIONS

This is a National Phase Application filed under 35 U.S.C. 371 as a national stage of PCT/CN2021/116037, filed Sep. 1, 2021, an application which claims the priority to Chinese Patent Application No. 202011166196.3 filed on Oct. 27, 2020, the entire contents of which are incorporated herein by reference.

TECHNICAL FIELD

The present disclosure relates to the field of display technology, and in particular, to a display module and a display device having the same.

BACKGROUND

In the related art, silicon-based Organic Light Emitting Diode (OLED) microdisplays are often used as near-eye displays in the technical fields such as Virtual Reality (VR) and Augmented Reality (AR), because the silicon-based Complementary Metal Oxide Semiconductor (CMOS) process is high in maturity degree and integration level and can realize ultra-high Pixels Per Inch (PPI) display.

Since the silicon-based OLED microdisplays are small in size and can realize the ultra-high PPI display and distances between anodes of the silicon-based OLED microdisplays are very small, serious crosstalk of silicon-based OLEDs often happens to adjacent sub-pixels due to light outgoing angles. More specifically, since an organic light emitting layer is generally formed by evaporation as an integral continuous film layer when an OLED device layer is fabricated, the organic light emitting layers corresponding to the adjacent sub-pixel regions are connected; and since the distances between the anodes are only a few tenths of a micrometer, light leakage and crosstalk often occurs between the adjacent sub-pixels, and especially for a tandem device, the light leakage and the crosstalk between the adjacent sub-pixels due to the light outgoing angles is more serious due to a relatively large thickness of the OLED device layer.

SUMMARY

For solving at least one of the technical problems in the prior art, the present disclosure provides a display module capable of improving a problem of light leakage and crosstalk between adjacent sub-pixels and increasing an intrusion path of water and oxygen.

The present disclosure further provides a display device having the above display module.

A display module according to an embodiment of a first aspect of the present disclosure, includes: a drive substrate; a pixel definition layer disposed on the drive substrate and defining a plurality of sub-pixel regions; an Organic Light Emitting Diode (OLED) device layer disposed on the pixel definition layer and including an organic light emitting layer, and a first electrode layer and a second electrode layer, which are located on two sides of the organic light emitting layer along a thickness direction of the organic light emitting layer; a color filter layer disposed on a side of the OLED device layer away from the drive substrate and including a plurality of sub-filter regions which are arranged opposite to the sub-pixel regions in a one-to-one correspondence way; and at least one blocking layer, wherein the blocking layer is provided, the blocking layer is disposed on the side of the OLED device layer away from the drive substrate, each blocking layer includes opening regions and light shielding regions, the opening regions are disposed to face the sub-pixel regions along a thickness direction of the drive substrate, each light shielding region is disposed to face portions of two adjacent sub-filter regions at which the two adjacent sub-filter regions are connected to each other, along the thickness direction of the drive substrate, and a length of a connecting line between two ends of each light shielding region is less than an actual length of the light shielding region on a cross section perpendicular to the drive substrate.

In the display module according to the embodiments of the present disclosure, the length of the connecting line between two ends of each light shielding region is less than the actual length of the corresponding light shielding region, so that the problem of light leakage and crosstalk between adjacent sub-pixels can be alleviated; moreover, the intrusion path of water and oxygen can be greatly increased, which reduces the possibility of the intrusion by water and oxygen from spliced positions of adjacent sub-pixels, so that the drive substrate can be prevented from being in contact with water and oxygen, thereby improving reliability and display effect of the display module.

In some embodiments, the light shielding regions are provided with first recesses recessed toward the drive substrate.

In some embodiments, on the cross section perpendicular to the drive substrate, each first recess is located at a widthwise central position of the corresponding light shielding region.

In some embodiments, the organic light emitting layer is continuous, the first electrode layer is disposed on a side of the organic light emitting layer close to the drive substrate and includes a plurality of sub-electrode layers spaced apart from each other, and the plurality of sub-electrode layers are respectively disposed in the plurality of sub-pixel regions in a one-to-one correspondence way.

In some embodiments, the second electrode layer is provided with second recesses recessed toward the drive substrate, and each second recess is disposed to face, along the thickness direction of the drive substrate, the portions of the two adjacent sub-filter regions at which the two adjacent sub-filter region are connected to each other.

In some embodiments, each light shielding region is provided with a first recess recessed toward the drive substrate, and a width of the first recess is less than that of the second recess on the cross section perpendicular to the drive substrate.

In some embodiments, the blocking layer is disposed on a side of the color filter layer away from the Organic Light Emitting Diode device layer.

In some embodiments, the display module further includes: at least one packaging layer, wherein the packaging layer includes an inner packaging layer disposed between the OLED device layer and the color filter layer, and/or an outer packaging layer disposed on the side of the color filter layer away from the OLED device layer, and the blocking layer is disposed on a side of the at least one packaging layer away from the OLED device layer.

In some embodiments, the at least one packaging layer is provided with third recesses recessed toward the drive substrate, and each third recess is disposed to face, along the thickness direction of the drive substrate, the portions of the two adjacent sub-filter regions at which the two adjacent sub-filter regions are connected to each other.

In some embodiments, the display module includes a plurality of inner packaging layers, which include a first packaging layer, a second packaging layer and a third packaging layer, wherein the second packaging layer is disposed on a side of the first packaging layer away from the OLED device layer, the third packaging layer is disposed between the first packaging layer and the second packaging layer, the blocking layer is disposed between the first packaging layer and the third packaging layer, and/or the blocking layer is disposed on a side of the second packaging layer away from the first packaging layer.

In some embodiments, the display module further includes: at least one inner packaging layer disposed between the OLED device layer and the color filter layer; and a planarization layer disposed between the inner packaging layer and the color filter layer, wherein the blocking layer is disposed between the at least one inner packaging layer and the planarization layer, and/or the blocking layer is disposed between the planarization layer and the color filter layer.

In some embodiments, wherein the blocking layer is fabricated by an etching process or a stripping process.

In some embodiments, on the cross section perpendicular to the drive substrate, a width of the light shielding region is greater than or equal to that of an area where crosstalk light passes at a corresponding position.

In some embodiments, a first dielectric layer, a second dielectric layer and a third dielectric layer are sequentially disposed between the OLED device layer and the color filter layer along a direction away from the drive substrate, the first dielectric layer has a thickness t1 and a refractive index n1, the second dielectric layer has a thickness t2 and a refractive index n2, the third dielectric layer has a thickness t3 and a refractive index n3, where n1>n2, and a critical incident light enters the second dielectric layer from the first dielectric layer at a critical angle α, then enters the third dielectric layer from the second dielectric layer at an incident angle β, and then enters the color filter layer from the third dielectric layer at an incident angle γ, the blocking layer includes at least one of a first light shielding layer, a second light shielding layer and a third light shielding layer, the first light shielding layer is located between the first dielectric layer and the second dielectric layer, the second light shielding layer is located between the second dielectric layer and the third dielectric layer, and the third light shielding layer is located between the third dielectric layer and the color filter layer; a width of a light shielding region of the first light shielding layer 7A is d1, where d1≥2*(t2*tan β+t3*tan β); a width of a light shielding region of the second light shielding layer 7B is d2, where d2≥2*t3*tan γ; and a width of a light shielding region of the third light shielding layer 7C is d3, where d3≥2*(t1*tan α+t2*tan β+t3*tan γ)−d, where d is a distance between two adjacent sub-pixel regions.

In some embodiments, two adjacent sub-filter regions are disposed such that edges of the sub-filter regions overlap.

In some embodiments, the blocking layer is a metal layer.

In the second aspect of the embodiments of the present disclosure, a display device includes a display module provided in the first aspect of the embodiments of the present disclosure.

By disposing the display module described above in the first aspect of the embodiments in the display device, overall display performance of the display device is improved.

Part of additional aspects and advantages of the present disclosure will be set forth in the description below, and part of the additional aspects and the advantages of the present disclosure will be apparent from the description below or may be learned through implementation of the present disclosure.

Figure 1:
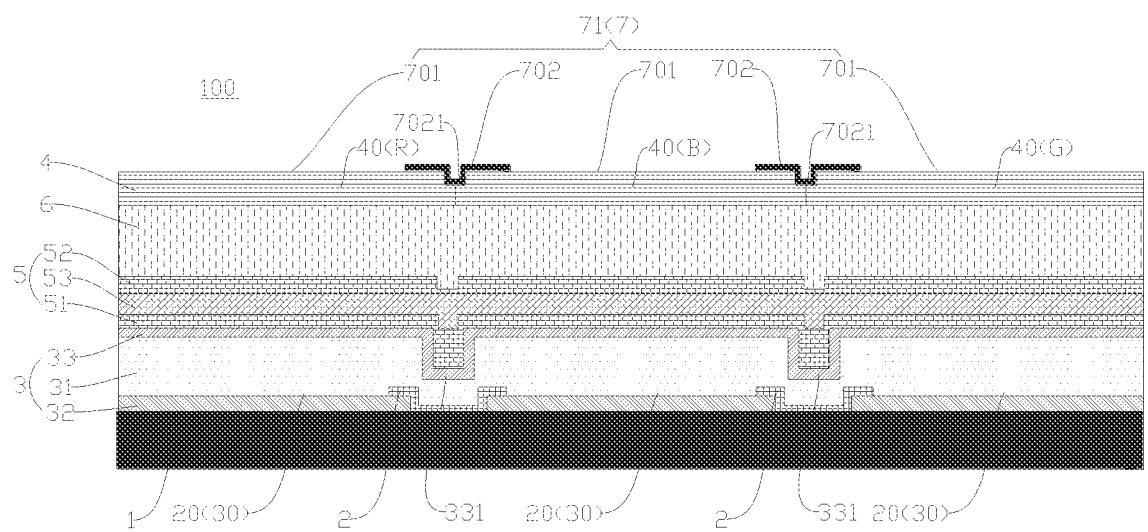
FIG. 1 is a sectional view of a display module according to an embodiment of the present disclosure.

REFERENCE NUMERALS a display module 100:
a drive substrate 1;
a pixel definition layer 2; a sub-pixel region 20;
an OLED device layer 3; an organic light emitting layer 31; a first electrode layer 32;
a second electrode layer 33; a sub-electrode layer 30; a second recess 331;
a color filter layer 4; a sub-filter region 40;
a packaging layer 5; a first packaging layer 51; a second packaging layer 52; a third
packaging layer 53;
an inner packaging layer 5A; an outer packaging layer 5B; a third recess 50;
a planarization layer 6;
a blocking layer 7; an opening region 701; a light shielding region 702; a first recess 7021;
a first blocking layer 71; a second blocking layer 72;
a third blocking layer 73; a fourth blocking layer 74;
a first light shielding layer 7A; a second light shielding layer 7B; a third light shielding layer 7C;
a first dielectric layer 8A; a second dielectric layer 8B; a third dielectric layer 8C.

DETAIL DESCRIPTION OF EMBODIMENTS

The embodiments of the present disclosure will be described in detail below, the examples of the described embodiments are illustrated by the drawings, and the same or similar reference numerals refer to the same or similar elements, or elements having they same or similar functions throughout the Description. The embodiments described below with reference to the drawings are illustrative and intended to explain the present disclosure, and should not be interpreted as limiting the present disclosure.

Several different embodiments or examples are given below for implementing different structures of the present disclosure. For simplifying the present disclosure, components and configurations in specific examples are described below. Apparently, the components and configurations are only for the examples and are not intended to limit the present disclosure. In addition, the reference numerals and/or letters may be repeated in the different examples of the present disclosure. The repetition is for the purpose of simplicity and clarity, and does not indicate a relationship between the discussed various embodiments and/or configurations. Moreover, examples of various specific processes and materials are provided herein, but those of ordinary skill in the art may envisage applicability of the other processes and/or the use of the other materials.

A display module 100 and a display device having the same according to the embodiments of the present disclosure will be described below with reference to the accompanying drawings.

As shown in FIG. 1, a display module 100 according to an embodiment of the present disclosure may include: a drive substrate 1, a pixel definition layer 2, an OLED device layer 3 and a color filter layer 4, the pixel definition layer 2 is disposed on the drive substrate 1 and defines a plurality of sub-pixel regions 20, the OLED device layer 3 is disposed on the pixel definition layer 2 and includes an organic light emitting layer 31 and first and second electrode layer 32 and 33 located on two sides of the organic light emitting layer 31 along a thickness direction of the organic light emitting layer 31, and the color filter layer 4 is disposed on a side of the OLED device layer 3 away from the drive substrate 1 and includes a plurality of sub-filter regions 40 which are arranged in a one-to-one correspondence to the sub-pixel regions 20, that is, one sub-pixel region 20 is arranged correspondingly to one sub-filter region 40 along a thickness direction of the display module 100.

It should be understood that each pixel on the display module may be generally composed of units of three primary colors, Red (R), Green (G) and Blue (B), and the unit of each color of each pixel is called a "sub-pixel". Apparently, the present disclosure is not limited thereto. For example, in addition to red (R) sub-pixels, green (G) sub-pixels and blue (B) sub-pixels, white (W) sub-pixels are added to some display modules. That is, in a film layer group composed of the OLED device layer 3, the color filter layer 4, and the film layers between the OLED device layer 3 and the color filter layer 4, portions corresponding to one sub-pixel region 20 along the thickness direction of the display module 100 form a "sub-pixel".

In addition, it should be understood that "OLED" is an abbreviation of Organic Light Emitting Diode, and one of the first electrode layer 32 and the second electrode layer 33 serves as a cathode layer, and the other of the first electrode layer 32 and the second electrode layer 33 serves as an anode layer. In addition, it should be understood that the color filter layer 4 is a Color Filter (CF), and the pixel definition layer 2 is a Pixel Definition Layer (PDL).

As shown in FIG. 1, the display module 100 further includes a blocking layer 7, at least one blocking layer 7 is provided and is disposed on the side of the OLED device layer 3 away from the drive substrate 1, and, each blocking layer 7 includes opening regions 701 and light shielding regions 702. The opening regions 701 are disposed in correspondence to the sub-pixel regions 20 along the thickness direction of the drive substrate 1, so as to enable light to be emitted out. The light shielding regions 702 are arranged in correspondence to the parts at which two adjacent sub-filter regions 40 connected along the thickness direction of the drive substrate 1; and on a cross section perpendicular to the drive substrate 1 (as shown in FIG. 1 and FIG. 2), a length (the length L shown in FIG. 2) of a connecting line between two ends of each light shielding region 702 is less than an actual length (a sum of the length L1, the length L2, the length L3, the length L4, the length L5 shown in FIG. 2) of the corresponding light shielding region 702 (i.e., the light shielding region 702), that is, for each light shielding region 702, a length of a connecting line between two ends is less than its actual length.

As can be seen, each light shielding region 702 is not in a shape of a straight line but is in a zigzag shape on the cross section perpendicular to the drive substrate 1, for example, the light shielding region 702 may be provided with a bulge, a recess, an oblique portion or even a curved portion, so as to allow the length of the connecting line between the two ends of the light shielding region 702 to be less than the actual length thereof. Thus, a problem of light leakage and crosstalk between adjacent sub-pixels can be alleviated; moreover, an intrusion path of water and oxygen can be greatly increased, which reduces the possibility of the intrusion by water and oxygen from spliced positions of adjacent sub-pixels, so that the drive substrate 1 is prevented from being in contact with water and oxygen, thereby improving reliability and display effect of the display module 100.

Figure 2:
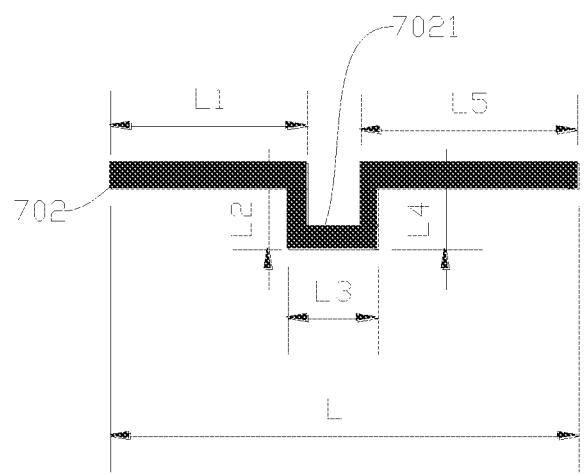
FIG. 2 is an enlarged view of a part of a light shielding region shown in FIG. 1.

In some embodiments of the present disclosure, as shown in FIG. 1 and FIG. 2, each light shielding region 702 is provided with a first recess 7021 recessed toward the drive substrate 1. Thus, the light shielding region 702 can be conveniently fabricated, and it can be simply and effectively ensured that the light shielding region 702 is not in the shape of the straight line but is in the zigzag shape on the cross section perpendicular to the drive substrate 1 to allow the length of the connecting line between the two ends of the light shielding region 702 to be less than the actual length thereof, so that the problem of light leakage and crosstalk between adjacent sub-pixels can be improved, and the intrusion path of water and oxygen can be greatly increased to prevent the drive substrate 1 from being in contact with water and oxygen, thereby improving the reliability and the display effect of the display module 100.

In some embodiments of the present disclosure, as shown in FIG. 1 and FIG. 2, on the cross section perpendicular to the drive substrate 1, each first recess 7021 is located at a widthwise central position of the corresponding light shielding region 702, so that the first recess 7021 may be arranged to directly or almost directly face, in a correspondence way, the positions at which two adjacent sub-filter regions 40 are joined, along the thickness direction of the drive substrate 1. Thus, the problem of light leakage and crosstalk between adjacent sub-pixels can be further improved, and the possibility of the intrusion by water and oxygen from the joint positions of the adjacent sub-pixels can be better reduced, so that the drive substrate 1 is prevented from being in contact with water and oxygen, thereby improving the reliability and the display effect of the display module 100.

In the display module 100 according some embodiments of the present disclosure, as shown in FIG. 2, the organic light emitting layer 31 may be continuous, i.e. being continuous at positions where adjacent sub-pixels are connected, in other words, the organic light emitting layers 31 are connected at positions corresponding to areas between the adjacent sub-pixel regions 20. The first electrode layer 32 is disposed on a side of the organic light emitting layer 31 close to the drive substrate 1 and includes a plurality of sub-electrode layers 30 which are respectively disposed in the plurality of sub-pixel regions 20 in a one-to-one correspondence way, that is, the first electrode layer 32 is not continuous at the positions where the adjacent sub-pixels are connected, so that the OLED device layer 3 may enable the display module 100 to be used in a Micro OLED display. Thus, the problem of light leakage and crosstalk between adjacent sub-pixels is solved by disposing the blocking layer 7.

In some embodiments of the present disclosure, the blocking layer 7 may be a metal layer, that is, a layer made of a metal material, so as to simply and effectively satisfy a requirement of ultra-high resolution, meet a requirement of ultra-high PPI of the Micro OLED display, reduce an adverse effect on an aperture ratio of pixels, and meet a display brightness requirement; moreover, by taking use of the characteristic of low transmittance of the metal, light is shielded at a position corresponding to a portion where two adjacent sub-filter regions 40 are connected, so as to avoid the problem of light leakage and crosstalk caused by light emission of the adjacent sub-pixels. Apparently, the blocking layer 7 according to the embodiments of the present disclosure is not limited to being applied to the Micro OLED display, for example, in some other embodiments of the present disclosure, the organic light emitting layer 31 may also be disconnected or discontinuous, for example, the organic light emitting layer 31 is disconnected or discontinuous at the positions where the adjacent sub-pixels are connected, which will not be described in detail here. In some embodiments of the present disclosure, the organic light emitting layer 31 may include one or more light emitting unit layers, and the light emitting unit layers include a hole injection layer, a hole transport layer, an emission layer, an electron transport layer and an electron injection layer, which are sequentially stacked along a direction away from the drive substrate 1.

In some embodiments of the present disclosure, as shown in FIG. 1, the second electrode layer 33 is provided with second recesses 331 recessed toward the drive substrate 1, and each second recess 331 is arranged to face portions of two adjacent sub-filter regions 40 at which the adjacent sub-filter regions 40 are connected to each other, along the thickness direction of the drive substrate 1. That is to say, the second electrode layer 33 is provided with the second recesses 331 each at a position corresponding to spliced positions of two adjacent sub-electrode layers 30, so that the problem of light leakage and crosstalk between adjacent sub-pixels can be effectively improved, and the possibility of the intrusion by water and oxygen from the spliced positions of the adjacent sub-pixels can be reduced, so as to prevent the drive substrate 1 from being in contact with water and oxygen, thereby further improving the reliability and the display effect of the display module 100.

Further, as shown in FIG. 1, when the second electrode layer 33 is provided with the second recesses 331, the light shielding regions 702 are provided with the first recesses 7021 recessed toward the drive substrate 1, and each first recess 7021 is disposed to face portions of the two adjacent sub-filter regions 40 at which the adjacent sub-filter regions 40 are connected to each other, along the thickness direction of the drive substrate 1, the problem of light leakage and crosstalk between adjacent sub-pixels can be further alleviated by disposing the first recesses 7021 and the second recesses 331, and the possibility of the intrusion by water and oxygen from the spliced positions of the adjacent sub-pixels can be better reduced, so as to prevent the drive substrate 1 from being in contact with water and oxygen, thereby further improving the reliability and the display effect of the display module 100.

Moreover, as shown in FIG. 1, in some embodiments, on the cross section perpendicular to the drive substrate 1, a width of each first recess 7021 (a width of the first recess 7021 along a left-right direction shown in FIG. 1, or the length of the connecting line between the two ends of the first recess 7021) is less than a width of each second recess 331 (a width of the second recess 331 along the left-right direction shown in FIG. 1, or a length of a connecting line between the two ends of the second recess 331). Thus, an adverse effect of the light shielding regions 702 on the aperture ratio of the pixels can be reduced, and the aperture ratio of the pixels can be ensured to be large enough to meet the display brightness requirement.

In the embodiments of the present disclosure, a specific location of the blocking layer 7 is not limited, and can be specifically selected according to actual requirements. For example, some specific embodiments will be given below, but the present disclosure is not limited thereto.

In some embodiments, as shown in FIG. 1, the blocking layer 7 is disposed on a side of the color filter layer 4 away from the OLED device layer 3. That is, at least one blocking layer 7 is disposed on the side of the color filter layer 4 away from the OLED device layer 3. Thus, it is easy to process, and the problem of light leakage and crosstalk between adjacent sub-pixels can be effectively improved.

In an example illustrated by FIG. 1, a first blocking layer 71 is disposed on the side of the color filter layer 4 away from the OLED device layer 3, the first blocking layer 71 is directly disposed on the color filter layer 4, and the light shielding regions 702 of the first blocking layer 71 are located on a portion where every two adjacent sub-filter regions 40 are connected, which facilitates processing.

Figure 3:
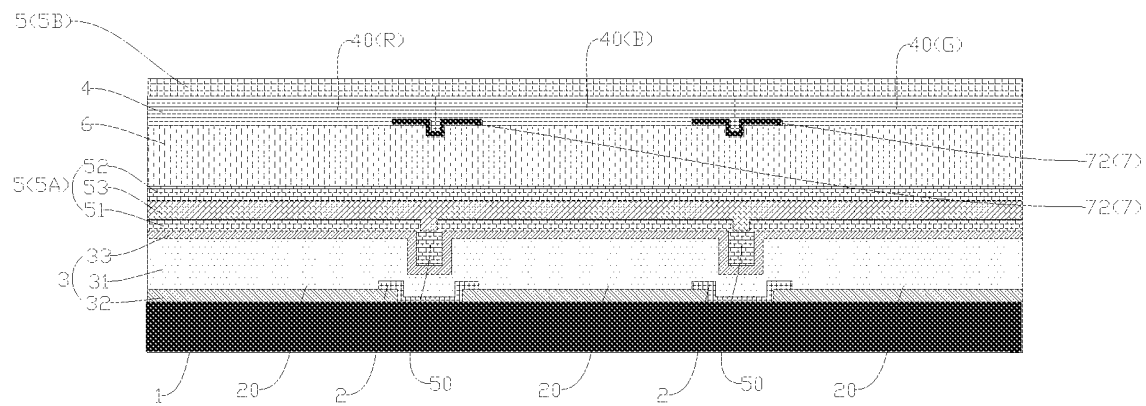
FIG. 3 is a sectional view of a display module according to another embodiment of the present disclosure.

In some embodiments, as shown in FIG. 3, the display module 100 further includes: a packaging layer 5, which is at least a single layer and includes an inner packaging layer 5A disposed between the OLED device layer 3 and the color filter layer 4 and/or an outer packaging layer 5B disposed on the side of the color filter layer 4 away from the OLED device layer 3. That is, the display module 100 includes: at least one inner packaging layer 5A and/or at least one outer packaging layer 5B, the inner packaging layer 5A is disposed between the OLED device layer 3 and the color filter layer 4, the outer packaging layer 5B is disposed on the side of the color filter layer 4 away from OLED device layer 3, and the blocking layer 7 is disposed on a side of at least one packaging layer 5 away from the OLED device layer 3. For example, each of a second blocking layer 72, a third blocking layer 73, and a fourth blocking layer 74, which are described below, is disposed on a side of at least one packaging layer 5 away from the OLED device layer 3. Thus, it is easy to process, a packaging effect can be ensured, and the problem of light leakage and crosstalk between adjacent sub-pixels can be effectively improved. The packaging layer 5 may be a Thin-Film Encapsulation (TFE) layer.

In some embodiments, as shown in FIG. 3, at least one packaging layer 5 is provided with third recesses 50 recessed toward the drive substrate 1, and each third recess 50 is disposed to face portions of two adjacent sub-filter regions 40 at which the two adjacent sub-filter regions 40 are connected to each other, along the thickness direction of the drive substrate 1. Thus, the problem of light leakage and crosstalk between adjacent sub-pixels can be further alleviated, and the possibility of the intrusion by water and oxygen from the spliced positions of the adjacent sub-pixels can be better reduced, so as to prevent the drive substrate 1 from being in contact with water and oxygen, thereby further improving the reliability and the display effect of the display module 100.

According to some embodiments of the present disclosure, as shown in FIG. 3, the display module 100 includes the inner packaging layer 5A and a planarization (PLN) layer 6, the inner packaging layer 5A is at least a single layer and is disposed between the OLED device layer 3 and the color filter layer 4, the planarization layer 6 is disposed between the inner packaging layer 5A and the color filter layer 4 (as shown in FIG. 3), the blocking layer 7 (e.g., the second blocking layer 72 described below) is disposed between the planarization layer 6 and the color filter layer 4, and/or the blocking layers 7 (e.g., the third blocking layer 73 and the fourth blocking layer 74 described below) are disposed between at least one inner packaging layer 5A and the planarization layer 6. Thus, it is easy to process, and the problem of light leakage and crosstalk between adjacent sub-pixels can be effectively improved.

Figure 4:
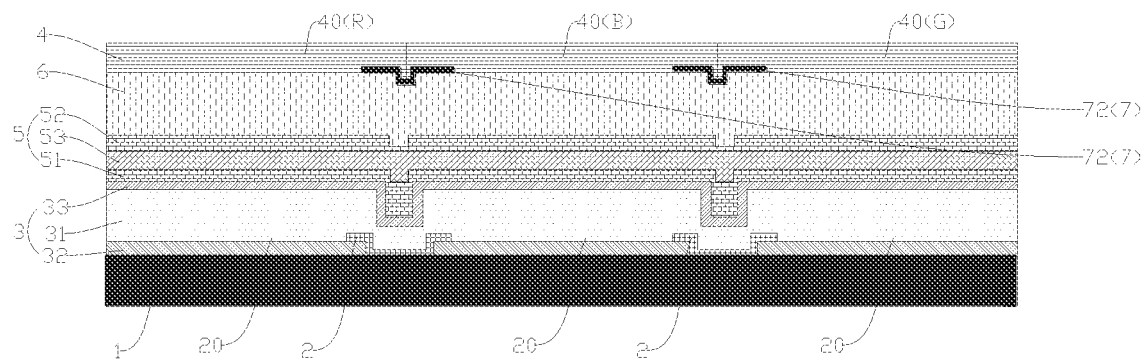
FIG. 4 is a sectional view of a display module according to another embodiment of the present disclosure.

In the examples illustrated by FIG. 3 and FIG. 4, the second blocking layer 72 is disposed on a side of the planarization layer 6 away from the OLED device layer 3, the second blocking layer 72 is directly disposed on the planarization layer 6, and the light shielding regions 702 of the second blocking layer 72 are located under a portion where every two adjacent sub-filter regions 40 are connected, which facilitates the processing.

Figure 5:
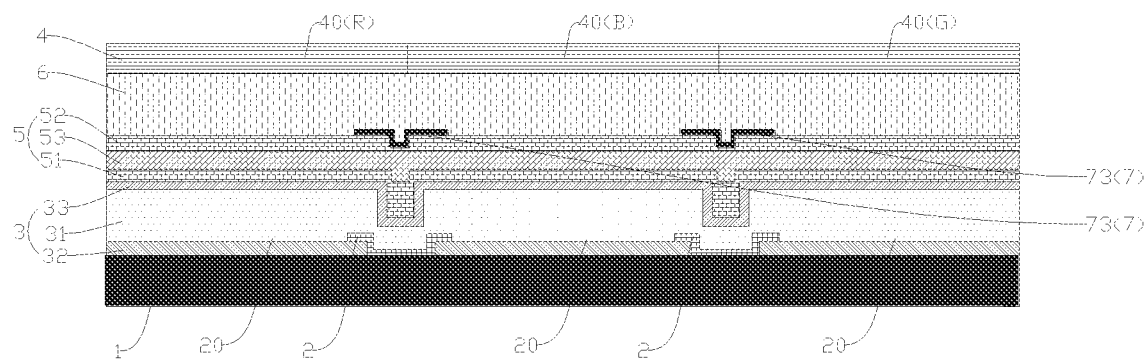
FIG. 5 is a sectional view of a display module according to another embodiment of the present disclosure.

In an example illustrated by FIG. 5, the packaging layer 5 is multi-layered and includes a first packaging layer 51, and a second packaging layer 52 disposed on a side of the first packaging layer 51 away from the OLED device layer 3. In some specific examples, the first packaging layer 51 and the second packaging layer 52 may be an organic TFE layer and an inorganic TFE layer, respectively. For example, in some other embodiments, the packaging layer 5 may further include a third packaging layer 53 disposed between the first packaging layer 51 and the second packaging layer 52, in which case both the first packaging layer 51 and the second packaging layer 52 may be inorganic TFE layers and the third packaging layer 53 may be an organic TFE layer. However, the present disclosure is not limited thereto.

In the example illustrated by FIG. 5, the third blocking layer 73 is disposed between the second packaging layer 52 and the planarization layer 6, the third blocking layer 73 is directly disposed on the second packaging layer 52, and the light shielding regions 702 of the third blocking layer 73 are located under a portion where every two adjacent sub-filter regions 40 are connected, which facilitates the processing and can effectively improve the problem of light leakage and crosstalk between adjacent sub-pixels; moreover, when the second packaging layer 52 is the inorganic TFE layer, a stable location of the third blocking layer 73 and a reliable blocking effect can be ensured.

Figure 6:
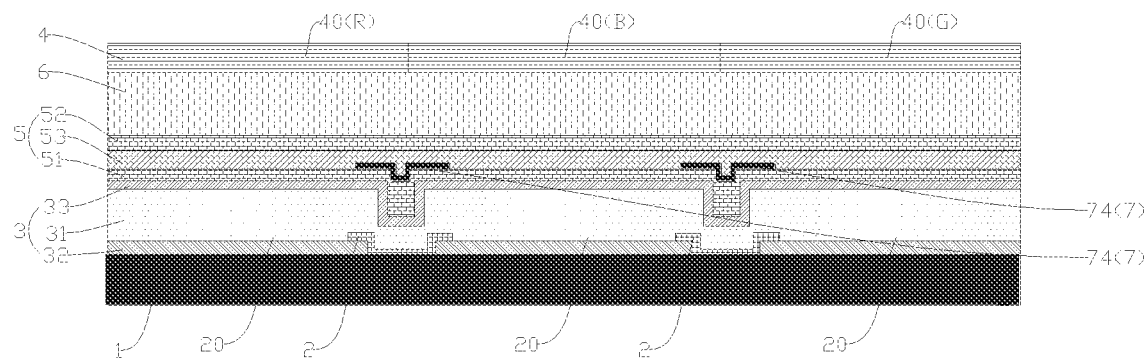
FIG. 6 is a cross-sectional view of a display module according to another embodiment of the present disclosure.

In an example illustrated by FIG. 6, the fourth blocking layer 74 is disposed between the first packaging layer 51 and the planarization layer 6, the fourth blocking layer 74 is directly disposed on the first packaging layer 51, and the light shielding regions 702 of the fourth blocking layer 74 are located under a portion where every two adjacent sub-filter regions 40 are connected, which facilitates the processing and can effectively improve the problem of light leakage and crosstalk between adjacent sub-pixels; moreover, when the first packaging layer 51 is the inorganic TFE layer, a stable location of the fourth blocking layer 74 and the reliable blocking effect can be ensured.

The display module 100 according to the embodiments of the present disclosure may include more than one (any two or more) of the blocking layers 7 described above at the same time. Thus, when the plurality of blocking layers 7 are provided, the problem of light leakage and crosstalk between adjacent sub-pixels can be improved more reliably and effectively. In addition, it should be understood that, when only one blocking layer 7 is provided, processing procedures can be simplified, and a relatively small overall thickness of the display module 100 can be ensured.

For example, the display module 100 according to some embodiments of the present disclosure includes a plurality of inner packaging layers 5A, which include the first packaging layer 51, the second packaging layer 52, and the third packaging layer 53, the second packaging layer 52 is disposed on a side of the first packaging layer 51 away from the OLED device layer 3, the third packaging layer 53 is disposed between the first packaging layer 51 and the second packaging layer 52, a packaging layer 5 (e.g., the fourth blocking layer 74 shown in FIG. 6) is disposed between the first packaging layer 51 and the third packaging layer 53 and/or a packaging layer 5 (e.g., the third blocking layer 73 shown in FIG. 5) is disposed on a side of the second packaging layer 52 away from the first packaging layer 51. Thus, it is easy to process, and the problem of light leakage and crosstalk between adjacent sub-pixels can be effectively solved; moreover, when the first packaging layer 51 and the second packaging layer 52 are the inorganic TFE layers, stable locations of the blocking layers 7 and the reliable blocking effect can be ensured.

Figure 7:
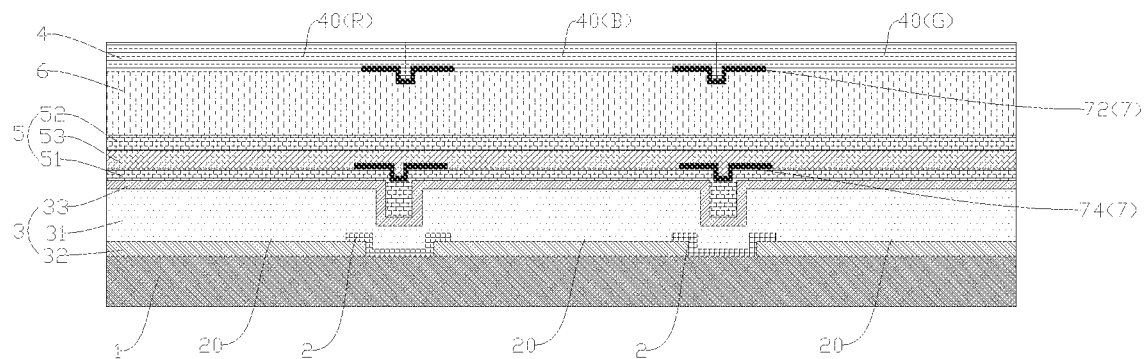
FIG. 7 is a sectional view of a display module according, to another embodiment of the present disclosure.

In a specific example illustrated by FIG. 7, the display module 100 further includes: the packaging layer 5 and the planarization layer 6, the packaging layer 5 is disposed on a side of the OLED device layer 3 away from the drive substrate 1, the planarization layer 6 is disposed between the packaging layer 5 and the color filter layer 4, the packaging layer 5 is multi-layered and includes the first packaging layer 51, the second packaging layer 52 and the third packaging layer 53, the second packaging layer 52 is disposed on a side of the first packaging layer 51 away from the OLED device layer 3, the third packaging layer 53 is disposed between the first packaging layer 51 and the second packaging layer 52, at least one blocking layer 7 is provided and includes at least one of the first blocking layer 71 (with reference to FIG. 1), the second blocking layer 72, the third blocking layer 73 (with reference to FIG. 5) and the fourth blocking layer 74, the first blocking layer 71 is directly disposed on the color filter layer 4, the second blocking layer 72 is directly disposed on the planarization layer 6, the third blocking layer 73 is directly disposed on the second packaging layer 52, and the fourth blocking layer 74 is directly disposed on the first packaging layer 51. Thus, when the plurality of blocking layers 7 are provided, the problem of light leakage and crosstalk between adjacent sub-pixels can be improved more reliably and effectively and when only one blocking layer 7 is provided, the processing procedures can be simplified, and the relatively small overall thickness of the display module 100 can be ensured.

Figure 8:
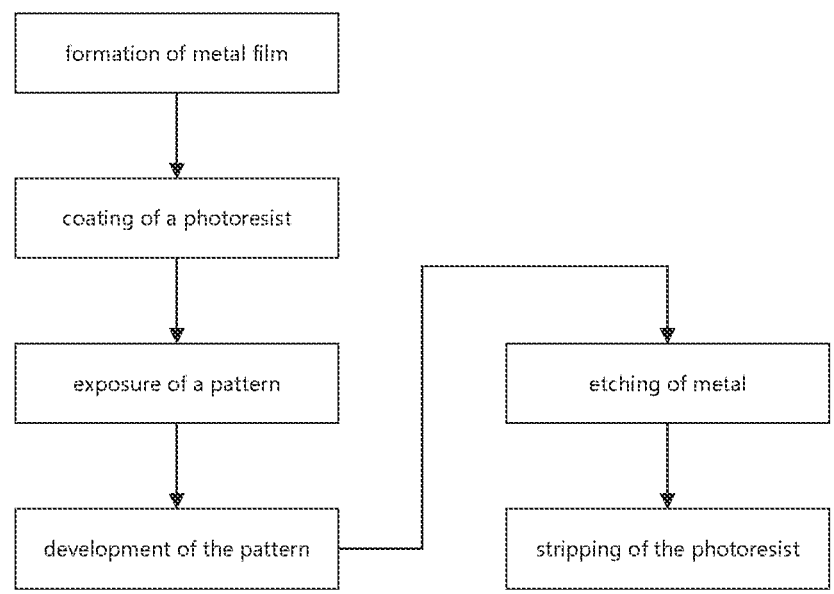
FIG. 8 is a flowchart illustrating a fabrication process of a blocking layer according to an embodiment of the present disclosure.
Figure 9:
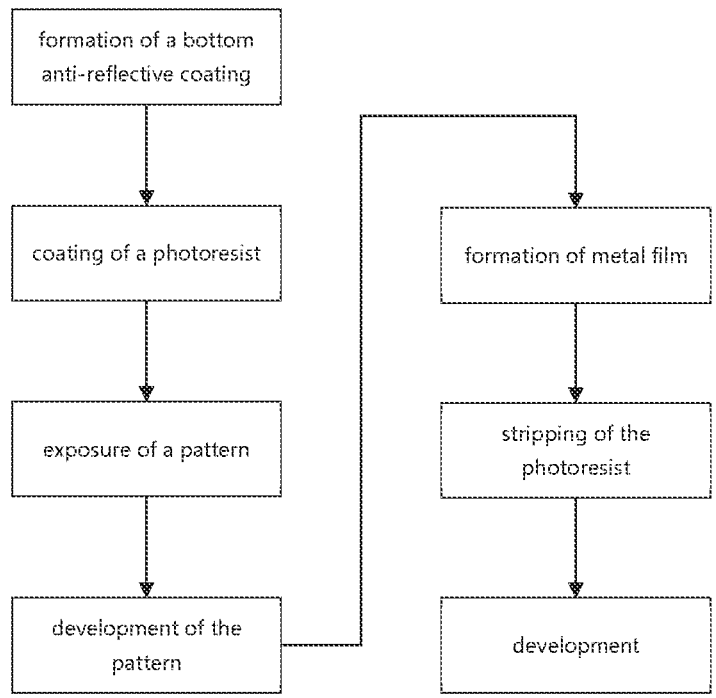
FIG. 9 is a flowchart illustrating a fabrication process a blocking layer according to another embodiment of the present disclosure.

In the display module 100 according to some embodiments of the present disclosure, the blocking layer 7 may be fabricated by an etching process or a stripping process. For example, as shown in FIG. 8, when the blocking layer 7 is fabricated by the etching process, the fabrication procedures may include formation of a metal film, coating of a photoresist, exposure of a pattern, development of the pattern, etching of metal, stripping of the photoresist, etc. For example, as shown in FIG. 9, when the blocking layer 7 is fabricated by the stripping process, the fabrication procedures may include formation of a bottom anti-reflective coating, coating of a photoresist, exposure of a pattern, development of the pattern, formation of a metal film, stripping of the photoresist, development, etc. Thus, a required blocking layer 7 can be simply and efficiently obtained. Apparently, the present disclosure is not limited thereto. In the other embodiments of the present disclosure, the blocking layer 7 may also be fabricated by other processes, for example, if the condition allows, the blocking layer 7 may be fabricated by the 3D printing technology. It should be noted that a material of the blocking layer 7 is not limited, and may be, for example, molybdenum (Mo) or aluminum (Al).

In some embodiments of the present disclosure, on the cross section perpendicular to the drive substrate 1, a length of a connecting line between two ends of each light shielding region 702 is regarded as a width of the light shielding region 702, and the width of the light shielding region 702 is greater than or equal to a width of an area where crosstalk light passes at a corresponding position. That is, each light shielding region 702 is required to cover an area where the crosstalk light may pass at the position where the light shielding region 702 is located. Thus, the problem of light leakage crosstalk between adjacent sub-pixels can be reliably and effectively avoided.

Figure 10:
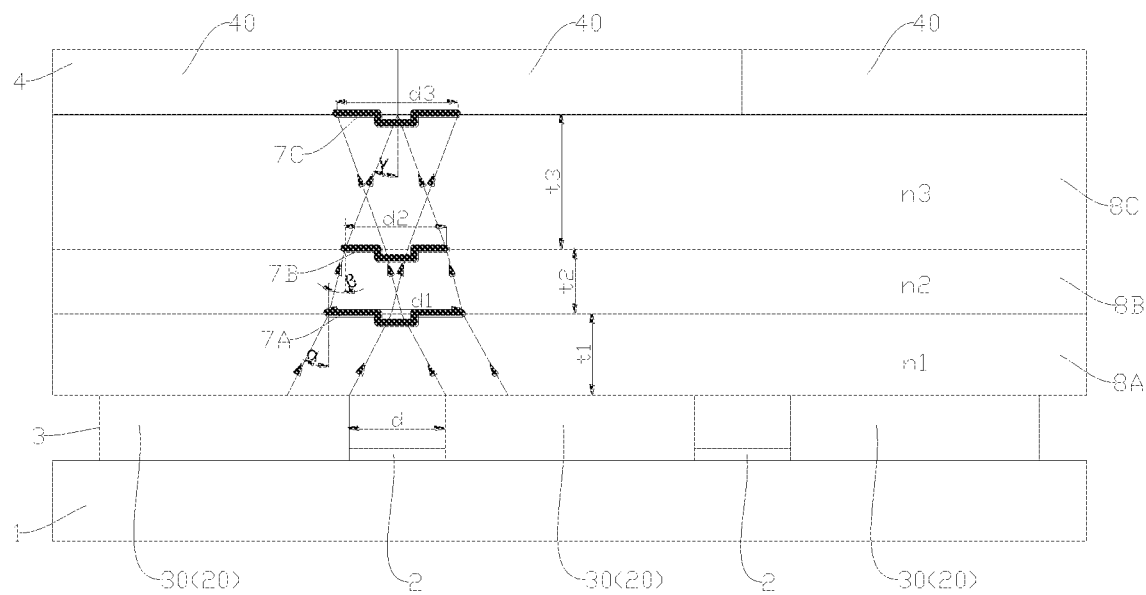
FIG. 10 is a sectional view of a display module according to an embodiment of the present disclosure.

In an example shown in FIG. 10, a first dielectric layer 8A, a second dielectric layer 8B and a third dielectric layer 8C are sequentially disposed between the OLED device layer 3 and the color filter layer 4 along a direction away from the drive substrate 1, the first dielectric layer 8A has a thickness t1 and a refractive index n1, the second dielectric layer 8B has a thickness t2 and a refractive index n2, and the third dielectric layer 8C has a thickness t3 and a refractive index n3, where n1>n2. A critical incident light enters the second dielectric layer 8B from the first dielectric layer 8A at a critical angle $\alpha$, then enters the third dielectric layer 8C from the second dielectric layer 8B at an incident angle $\beta$, and then enters the color filter layer 4 from the third dielectric layer 8C at an incident angle $\gamma$. It should be understood that the incident angle $\beta$ is equal to a refraction angle of the critical incident light generated when the critical incident light enters the second dielectric layer 8B from the first dielectric layer 8A, and the incident angle $\gamma$ is equal to a refraction angle of the critical incident light when the critical incident light enters the third dielectric layer 8C from the second dielectric layer 8B, so that $\alpha$, $\beta$ and $\gamma$ can be calculated after n1, n2 and n3 are determined.

As shown in FIG. 10, the blocking layer 7 includes at least one of a first light shielding layer 7A, a second light shielding layer 7B and a third light shielding layer 7C, the first light shielding layer 7A is located between the first dielectric layer 8A and the second dielectric layer 8B, the second light shielding layer 7B is located between the second dielectric layer 8B and the third dielectric layer 8C, and the third light shielding layer 7C is located between the third dielectric layer 8C and the color filter layer 4. As shown in FIG. 10, a width of a light shielding region 702 of the first light shielding layer 7A is d1, which satisfies that $d1 \geq 2*(t2*\tan\beta + t3*\tan\gamma)$; a width of a light shielding region 702 of the second light shielding layer 7B is d2, which satisfies that $d2 \geq 2*t3*\tan\gamma$; and a width of a light shielding region 702 of the third light shielding layer 7C is d3, which satisfies that $d3 \geq 2*(t1*\tan\alpha + t2*\tan\beta + t3*\tan\gamma) - d$.

Where d is a distance between two adjacent sub-pixel regions 20. It should be understood that, when the organic light emitting layer 31 is continuous, the distance between two adjacent sub-pixel regions 20 is a distance between two adjacent sub-electrode layers 30. Thus, it can be simply and effectively ensured that a distance between the light shielding regions 702 is greater than or equal to a distance between the areas where the crosstalk light pass at the corresponding positions. In some embodiments, n1>n2>n3, so that a good light emission effect of the display module 100 can be ensured.

Specifically, when the OLED device layer 3 emits light, part of the light from the first dielectric layer 8A to the second dielectric layer 8B is subjected to total reflection due to a light outgoing angle, and part of the light close to an edge of each sub-pixel enters an adjacent sub-pixel, resulting in crosstalk. By designing the widths of the first light shielding layer 7A, the second light shielding layer 7B and the third light shielding layer 7C in the above way, it can be ensured that each light shielding region 702 covers an area where the crosstalk light may pass at a position where the light shielding region 702 is located, thereby reliably and effectively avoiding the problem of light leakage and crosstalk between adjacent sub-pixels.

It should be noted that the above calculation solution only provides a calculation idea; apparently, the display module 100 according to the embodiments of the present disclosure is not limited to including the above number of dielectric layers, for example, only one or two or more than three dielectric layers may be disposed between the OLED device layer 3 and the color filter layer 4. Calculation can be carried out according to the above calculation idea in any case, so as to ensure that that each light shielding region 702 covers the area where the crosstalk light may pass at the position where the light shielding region 702 is located, which will not be described in detail here.

In some embodiments of the present disclosure, two adjacent sub-filter regions 40 may be disposed in such a way that edges of the sub-filter regions 40 overlap, so that the problem between of crosstalk between adjacent sub-pixels can be further improved, and the intrusion path of water and oxygen can be greatly increased, which reduces the possibility of the intrusion by water and oxygen from spliced positions of adjacent sub-pixels, so that the drive substrate 1 is prevented from being in contact with water and oxygen, thereby improving the reliability and the display effect of the display module 100.

In addition, it should be noted that specific structural dimensions of each layer according to the embodiments of the present disclosure are not limited, for example, the second electrode layer 33 serves as the anode layer and may have a thickness from 80 nm to 120 nm, and the distance between the adjacent sub-electrode layers 30 may range from 0.2 μm to 0.1 μm; the first electrode layer 32 may serve as the cathode layer and have a thickness from 8 nm to 20 nm; a thickness of the organic light emitting layer 31 may range from 130 nm to 400 nm; and a thickness of the pixel definition layer 2 may range from 30 nm to 150 nm. A depth and the width of each first recess 7021 are not limited and may be set according to actual conditions, for example, the depth of each first recess 7021 may be less than twice the maximum thickness of the blocking layer 7, with the depth of each first recess 7021 referring to the maximum depth of the first recess 7021. The width of each first recess 7021 may be greater than 1/5 of the width of each light shielding region 702 and less than 4/5 of the width of each light shielding region 702. Thus, on the premise that a processing requirement can be met, the problem of crosstalk between adjacent sub-pixels can be improved more reliably, and it can be reliably ensured that the intrusion path of water and oxygen is increased.

A display device according to the embodiments of the present disclosure is not limited to a specific type, and includes the display module 100 according to the embodiments of the present disclosure. Since the display module 100 is provided with the blocking layer 7, the problem of light leakage and crosstalk between adjacent sub-pixels can be reliably and effectively avoided, thereby improving an overall display device effect of the display device. In addition, it should be noted that other components and operations of the display device according to the embodiments of the present disclosure are known to those of ordinary skill in the art after the specific type of the display device is determined, and thus will not be described in detail here.

Further, the terms "first", "second", "third" and "fourth" are only used for description, and should not be interpreted as indicating or implying relative importance or implicitly indicating the number of the described technical features. Thus, a feature defined by "first", "second", "third" or "fourth" can explicitly or implicitly include one or more of the features. In the description of the present disclosure, "a plurality" means two or more, unless otherwise defined. In the present disclosure, unless expressly stated or limited otherwise, a first feature being "on" or "under" a second feature may be the case where the first feature is in direct contact with the second feature or the case where the first feature is in indirect contact with the second feature through an intermediate medium.

In the Description, the reference terms such as "one embodiment", "some embodiments", "an example", "a specific example" and "some examples" indicate that the specific features, structures, materials or characteristics described in conjunction with the embodiment(s) or example(s) are included in at least one embodiment or example of the present disclosure. In the Description, the illustrative descriptions of the above terms are not necessarily for the same embodiment or example. Moreover, the specific features, structures, materials or characteristics described may be combined in any suitable way in any one or more embodiments or examples. Further, those of ordinary skill in the art may combine the different embodiments or examples and the features therein described in the Description.

Although the embodiments of the present disclosure are illustrated and described, it should be understood by those of ordinary skill in the art that: various changes, modifications, substitutions and variations can be made to the embodiments without away from the principle and spirit of the present disclosure, the scope of the present disclosure is defined by the Claims and the equivalent thereof.

What is claimed is:

1. A display module (100), comprising:
a drive substrate (1);
a pixel definition layer (2) disposed on the drive substrate (1) and defining a plurality of sub-pixel regions (20);
an organic light Emitting diode (OLED) device layer (3) disposed on the pixel definition layer (2) and comprising an organic light emitting layer (31), and a first electrode layer (32) and a second electrode layer (33), which are located on two sides of the organic light emitting layer (31) along a thickness direction of the organic light emitting layer (31);
a color filter layer (4) disposed on a side of the OLED device layer (3) away from the drive substrate (1) and comprising a plurality of sub-filter regions (40) which are arranged opposite to the sub-pixel regions (20) in a one-to-one correspondence way; and
at least one blocking layer (7), wherein the blocking layer (7) is disposed on the side of the OLED device layer (3) away from the drive substrate (1), each blocking layer (7) comprises opening regions (701) and light shielding regions (702), the opening regions (701) are disposed to face the sub-pixel regions (20) along a thickness direction of the drive substrate (1), each light shielding region (702) is disposed to face portions of two adjacent sub-filter regions (40) at which the two adjacent sub-filter regions (40) are connected to each other, along the thickness direction of the drive substrate (1), and a length of a connecting line between two ends of each light shielding region (702) is less than an actual length of the light shielding region (702) on a cross section perpendicular to the drive substrate (1);
wherein a first dielectric layer (8A), a second dielectric layer (8B) and a third dielectric layer (8C) are sequentially disposed, along a direction away from the drive substrate (1), between the OLED device layer (3) and the color filter layer (4), the first dielectric layer (8A) has a thickness t1 and a refractive index n1, the second dielectric layer (8B) has a thickness t2 and a refractive index n2, the third dielectric layer (8C) has a thickness t3 and a refractive index n3, where n1>n2, and a critical incident light enters the second dielectric layer (8B) from the first dielectric layer (8A) at a critical angle α, then enters the third dielectric layer (8C) from the second dielectric layer (8B) at an incident angle β, and then enters the color filter layer (4) from the third dielectric layer (8C) at an incident angle γ,
the blocking layer (7) comprises at least one of a first light shielding layer (7A), a second light shielding layer (7B) and a third light shielding layer (7C), the first light shielding layer (7A) is located between the first dielectric layer (8A) and the second dielectric layer (8B), the second light shielding layer (7B) is located between the second dielectric layer (8B) and the third dielectric layer (8C), and the third light shielding layer (7C) is located between the third dielectric layer (8C) and the color filter layer (4);
a width of a light shielding region (702) of the first light shielding layer 7A is d1, where $d1 \geq 2*(t2*\tan \beta + t3*\tan \gamma)$;
a width of a light shielding region (702) of the second light shielding layer 7B is d2, where $d2 \geq 2*t3*\tan \gamma$; and
a width of a light shielding region (702) of the third light shielding layer 7C is d3, where $d3 \geq 2*(t1*\tan \alpha + t2*\tan \beta + t3*\tan \gamma) - d$, where d is a distance between two adjacent sub-pixel regions (20).

2. The display module (100) of claim 1, wherein the light shielding regions (702) are provided with first recesses (7021) recessed toward the drive substrate (1).

3. The display module (100) of claim 2, wherein, on the cross section perpendicular to the drive substrate (1), each first recess (7021) is located at a widthwise central position of a corresponding one of the light shielding regions (702).

4. The display module (100) of claim 1, wherein the organic light emitting layer (31) is continuous, the first electrode layer (32) is disposed on a side of the organic light emitting layer (31) close to the drive substrate (1) and comprises a plurality of sub-electrode layers (30) spaced apart from each other, and the plurality of sub-electrode layers (30) are respectively disposed in the plurality of sub-pixel regions (20) in a one-to-one correspondence way.

5. The display module (100) of claim 4, wherein the second electrode layer (33) is provided with second recesses (331) recessed toward the drive substrate (1), and each second recess (331) is disposed to face, along the thickness direction of the drive substrate (1), the portions of the two adjacent sub-filter regions (40) at which the two adjacent sub-filter regions (40) are connected to each other.

6. The display module (100) of claim 5, wherein each light shielding region (702) is provided with a first recess (7021) recessed toward the drive substrate (1), and a width of the first recess (7021) is less than that of the second recess (331) on the cross section perpendicular to the drive substrate (1).

7. The display module (100) of claim 1, wherein the blocking layer (7) is disposed on a side of the color filter layer (4) away from the OLED device layer (3).

8. The display module (100) of claim 1, further comprising:
at least one packaging layer (5), wherein the packaging layer (5) comprises an inner packaging layer (5A) disposed between the OLED device layer (3) and the color filter layer (4), and/or an outer packaging layer (5B) disposed on the side of the color filter layer (4) away from the OLED device layer (3), and the blocking layer (7) is disposed on a side of the at least one packaging layer (5) away from the OLED device layer (3).

9. The display module (100) of claim 8, wherein the at least one packaging layer (5) is provided with third recesses (50) recessed toward the drive substrate (1), and each third recess (50) is disposed to face, along the thickness direction of the drive substrate (1), the portions of the two adjacent sub-filter regions (40) at which the two adjacent sub-filter regions (40) are connected to each other.

10. The display module (100) of claim 8, comprising a plurality of inner packaging layers (5A), which comprise a first packaging layer (51), a second packaging layer (52) and a third packaging layer (53), wherein the second packaging layer (52) is disposed on a side of the first packaging layer (51) away from the OLED device layer (3), the third packaging layer (53) is disposed between the first packaging layer (51) and the second packaging layer (52), the blocking layer (7) is disposed between the first packaging layer (51) and the third packaging layer (53), and/or the blocking layer (7) is disposed on a side of the second packaging layer (52) away from the first packaging layer (51).

11. The display module (100) of claim 1, further comprising:
at least one inner packaging layer (5A) disposed between the OLED device layer (3) and the color filter layer (4); and
a planarization layer (6) disposed between the inner packaging layer (5A) and the color filter layer (4), wherein the blocking layer (7) is disposed between the at least one inner packaging layer (5A) and the planarization layer (6), and/or the blocking layer (7) is disposed between the planarization layer (6) and the color filter layer (4).

12. The display module (100) of claim 1, wherein, on the cross section perpendicular to the drive substrate (1), a width of the light shielding region (702) is greater than or equal to that of an area where crosstalk light passes at a corresponding position.

13. The display module (100) of claim 1, wherein two adjacent sub-filter regions (40) are disposed such that edges of the sub-filter regions (40) overlap.

14. The display module (100) of claim 1, wherein the blocking layer (7) is a metal layer.

15. A display device, comprising a display module (100) of claim 1.

* * * * *